(12) United States Patent
Chen et al.

(10) Patent No.: US 11,972,799 B2
(45) Date of Patent: Apr. 30, 2024

(54) FILAMENT FORMING METHOD FOR RESISTIVE MEMORY UNIT

(71) Applicant: Winbond Electronics Corp., Taichung (TW)

(72) Inventors: Frederick Chen, San Jose, CA (US);
Ping-Kun Wang, Taichung (TW);
Chia-Hung Lin, Taichung (TW);
Jun-Yao Huang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 129 days.

(21) Appl. No.: 17/683,356

(22) Filed: Mar. 1, 2022

(65) Prior Publication Data
US 2023/0282279 A1    Sep. 7, 2023

(51) Int. Cl.
*G11C 13/00* (2006.01)
(52) U.S. Cl.
CPC ........ *G11C 13/004* (2013.01); *G11C 13/0007* (2013.01); *G11C 2013/0045* (2013.01)
(58) Field of Classification Search
CPC .............. G11C 13/004; G11C 13/0007; G11C 2013/0045
See application file for complete search history.

(56) References Cited

U.S. PATENT DOCUMENTS

| 7,978,510 | B2 | 7/2011 | Modha et al. |
| 8,737,115 | B2 | 5/2014 | Yamazaki et al. |
| 9,524,776 | B2 | 12/2016 | Kawai et al. |
| 9,679,647 | B2 | 6/2017 | Ueki et al. |
| 2011/0176351 | A1 | 7/2011 | Fujitsuka et al. |
| 2013/0094276 | A1 | 4/2013 | Torsi |
| 2014/0289448 | A1 | 9/2014 | Koudele |
| 2015/0356006 | A1 | 12/2015 | Perner |
| 2017/0117055 | A1 | 4/2017 | Kim et al. |
| 2018/0025778 | A1* | 1/2018 | Mori ................ G11C 13/004 365/148 |
| 2019/0392897 | A1 | 12/2019 | Lu et al. |

FOREIGN PATENT DOCUMENTS

TW    I534807    5/2016

* cited by examiner

*Primary Examiner* — Sultana Begum
(74) *Attorney, Agent, or Firm* — JCIPRNET

(57) ABSTRACT

A filament forming method includes: performing first stage to apply first bias including gate and drain voltages to a resistive memory unit plural times until read current reaches first saturating state, latching read current in first saturating state as saturating read current, determining whether rate of increase of saturating read current is less than first threshold value; when rate of increase of saturating read current is not less than first threshold value, performing second stage to apply second bias, by increasing gate voltage and decreasing drain voltage, to the resistive memory unit plural times until read current reaches second saturating state, latching read current in second saturating state as saturating read current and determining whether rate of increase of saturating read current is less than first threshold value; finishing the method when rate of increase of saturating read current is less than first threshold value and saturating read current reaches target current value.

14 Claims, 6 Drawing Sheets

FILAMENT FORMING METHOD FOR RESISTIVE MEMORY UNIT

BACKGROUND

Technical Field

The invention relates to a resistive forming method of a resistive memory unit.

Description of Related Art

The resistive memory has the potential advantages of low power consumption, high-speed operation, high density, and compatibility with complementary metal oxide semiconductor process technology, and thus it is very suitable for the next generation of non-volatile memory devices.

FIG. 1 is a schematic diagram showing the structure of a general 1T1R resistive memory. As shown in FIG. 1, a resistive memory usually includes a resistive element R and a switching element T. The resistance element R includes an upper electrode 14b and a lower electrode 14a arranged oppositely, and a dielectric layer (for example, a transition metal oxide, TMO) 12 located between the upper electrode 14b and the lower electrode 14a. Before the resistive memory can repeatedly switch between high and low resistance states to store data, a filament forming process is first required. The filament forming process includes applying a bias voltage to the resistive memory. For example, a gate voltage Vg is applied to the gate of the switching element T, and a drain voltage Vd is applied to the upper electrode 14b of the resistance element R. The mentioned bias voltage, such as a positive bias voltage, is applied so that oxygen vacancy and oxygen ions are generated in the dielectric layer, the oxygen ions escape from the dielectric layer (TMO), and then a current path (filament structure) is formed in the dielectric layer. As a result, the resistive memory is changed from a high resistance state to a low resistance state. Afterwards, a RESET or SET process can be performed to the resistive memory so as to switch the resistive memory to the high-resistance state or the low-resistance state respectively to complete data storage.

FIG. 2 shows the relationship between the voltage applied to the dielectric layer (such as TMO) and the forming current (i.e., the read current after finishing the forming process) during the filament forming process and the correlation with the gate voltage. It can be seen from FIG. 2 that when the gate voltage Vg is above 1.5V, the voltage applied to the TMO will be too small (below 0.3V as shown), and no sufficient electric field to push the oxygen ions to escape from the TMO. If the gate voltage Vg is too low (such as Vg=0.65V), although the voltage applied to the TMO increases, the forming current is almost zero. It means that no sufficient oxygen vacancy is generated in the TMO to form the current path. Therefore, it is difficult to select a suitable gate voltage to perform the filament forming, and thus the forming efficiency is not good.

FIG. 3 illustrates a graph of current variation before and after the initial ($1^{st}$) RESET after the filament forming is performed, in which the X axis represents the current before the initial RESET and the Y axis represents the current after the initial RESET. When the initial RESET is performed when the current too early after the filament forming process, many bits will increase rather than decrease current from RESET. Namely, the formed filament structure may be not stable enough, resulting in a degraded reliability of the resistive memory. This is also related to the forming efficiency.

SUMMARY

In summary, there is a need for a more reliable forming method to remove sufficient oxygen ions from TMO to form a stable filament structure and reduce the occurrence of current tail state.

According to an embodiment of the present disclosure, a filament forming method for a resistive memory unit is provided. The filament forming method comprises: applying a first bias voltage to the resistive memory unit for plural times until a read current of the resistive memory unit reaches a first saturating state, wherein the first bias for each time includes a gate voltage and a drain voltage; latching the read current in the first saturating state as a saturating read current; determining whether or not rate of increase of the saturating read current is less than a first threshold value, wherein when oxygen vacancy and oxygen ions are further generated in a dielectric layer of the resistive memory unit and the resistive memory unit does not reach a stable state, the saturating read current is further increased; when the rate of increase of the saturating read current is determined to be not less than the first threshold value, increasing the gate voltage and decreasing the drain voltage of the first bias voltage to serve as a second bias voltage; applying the second bias to the resistive memory unit until the read current of the resistive memory unit reaches a second saturating state, and determining whether or not the rate of increase of the saturating read current is less than the first threshold value; and determining whether or not the saturating read current reaches a target current value, and finishing the filament forming method when the target current value is reached.

According to another embodiment of the present disclosure, a filament forming method of a resistive memory unit is provided. The filament forming method comprises: performing a first stage forming process to apply a first bias voltage including a gate voltage and a drain voltage to the resistive memory unit for plural times until a read current of the resistive memory unit reaches a first saturating state, latching the read current in the first saturating state as a saturating read current, and determining whether or not a rate of increase of the saturating read current is less than a first threshold value, wherein when oxygen vacancy and oxygen ions are further generated in a dielectric layer of the resistive memory unit and the resistive memory unit does not reach a stable state, the saturating read current is further increased; when the rate of increase of the saturating read current is determined to be not less than the first threshold value, performing a second stage forming process to apply a second bias voltage, wherein a second bias voltage is applied to the resistive memory unit for plural times until the read current of the resistive memory unit reaches a second saturating state, latching the read current in the second saturating state as the saturating read current and determining whether or not the rate of increase of the saturating read current is less than the first threshold value, wherein the second bias voltage is obtained by increasing the gate voltage and decreasing the drain voltage; and when the rate of increase of the saturating read current is less than the first threshold value, and the saturating read current reaches a target current value, finishing the filament forming method.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
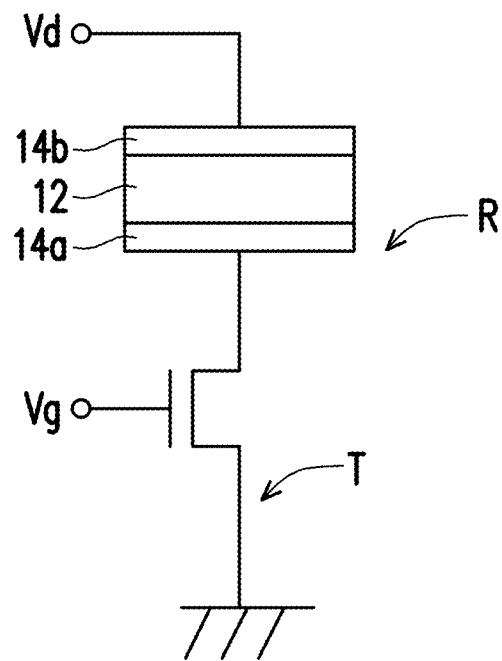
FIG. 1 is a schematic diagram showing the structure of a general 1T1R resistive memory.
Figure 2:
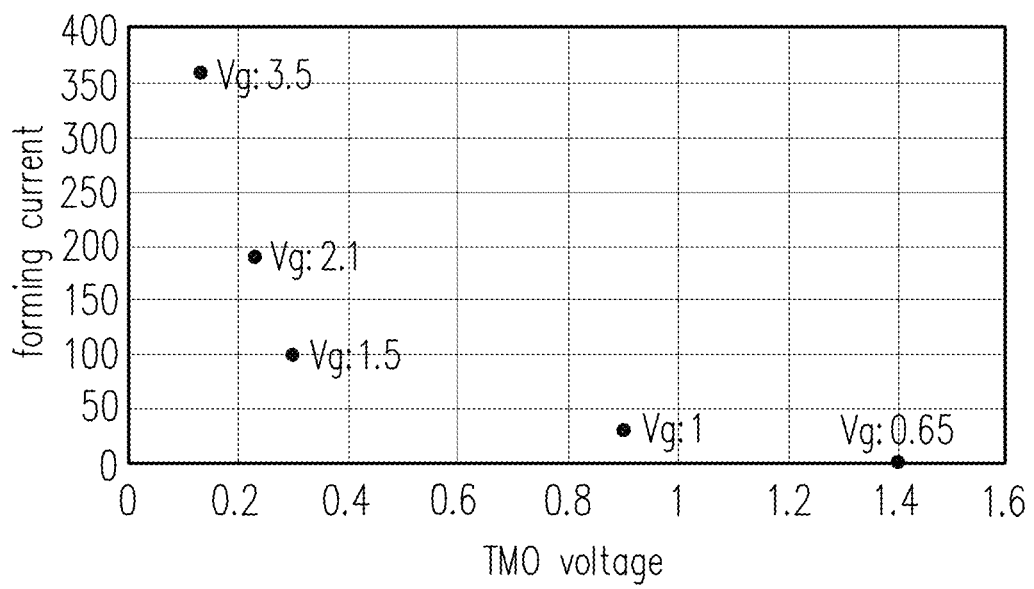
FIG. 2 shows the relationship between the voltage applied to the dielectric layer and the forming current during the forming process and the correlation with the gate voltage.
Figure 3:
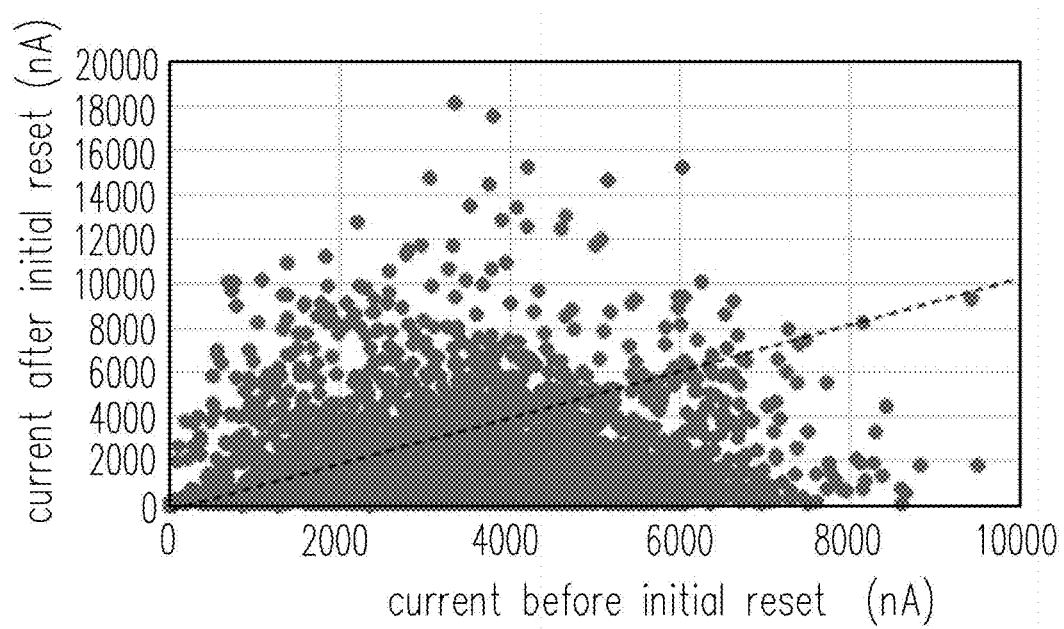
FIG. 3 shows the related distribution diagram of the current before initial RESET and current after initial RESET based on a current method.

The most basic resistive memory unit comprises of a switching element (such as a transistor) and a resistive element (1T1R). Referring to FIG. 1 as an example, the resistive element comprises an upper and a lower layers of metal electrodes and a middle layer such as a dielectric layer (for example, transition metal oxide, TMO). The following embodiments will be described with a resistive memory unit with a 1T1R structure, but not limited thereto. The method disclosed in this embodiment can also be applied to other resistive memory unit structures such as 2T1R or 2T2R.

Figure 4:
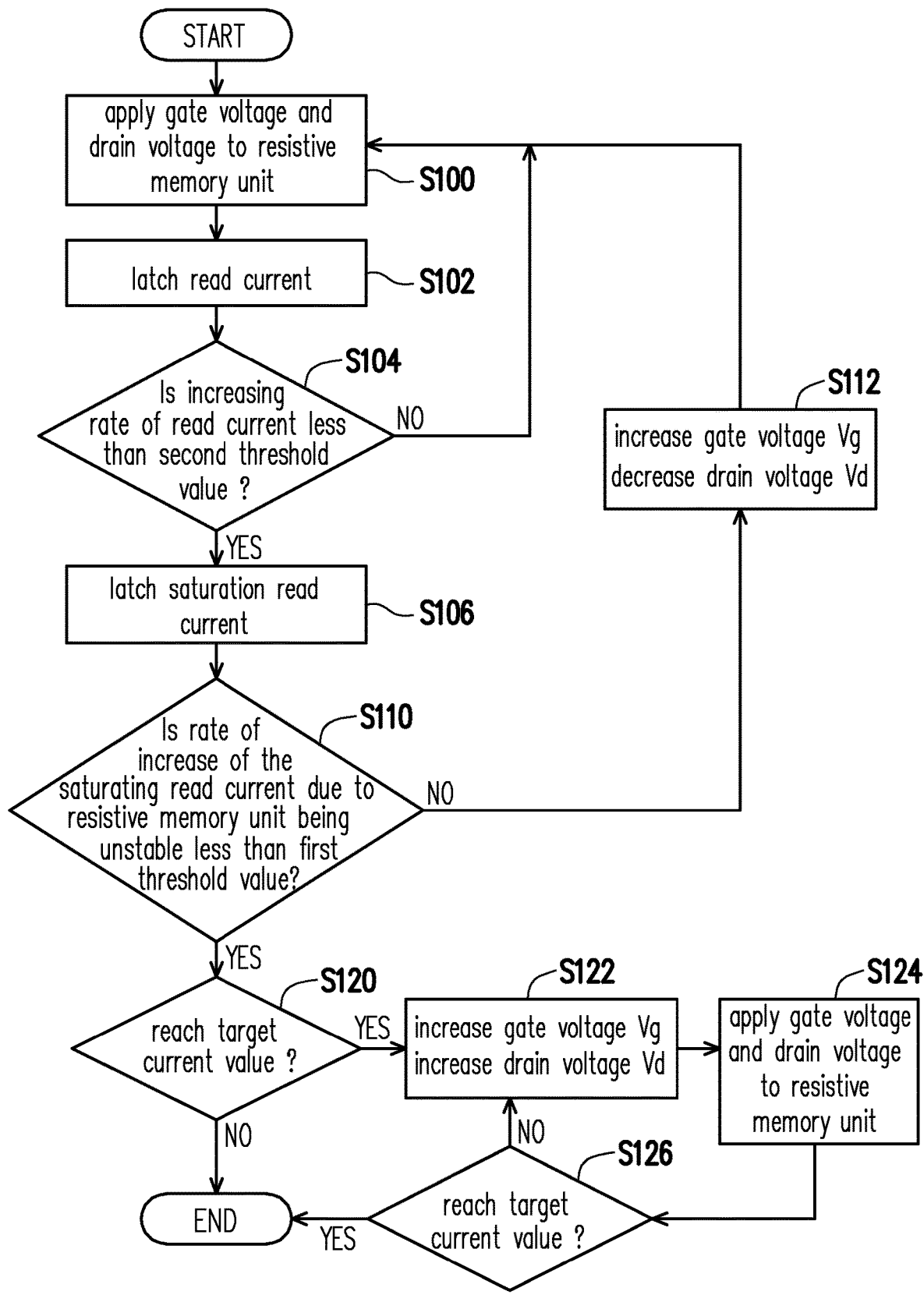
FIG. 4 is a schematic flowchart of the filament forming method of the resistive memory according to the embodiment of the disclosure.
Figure 5A:
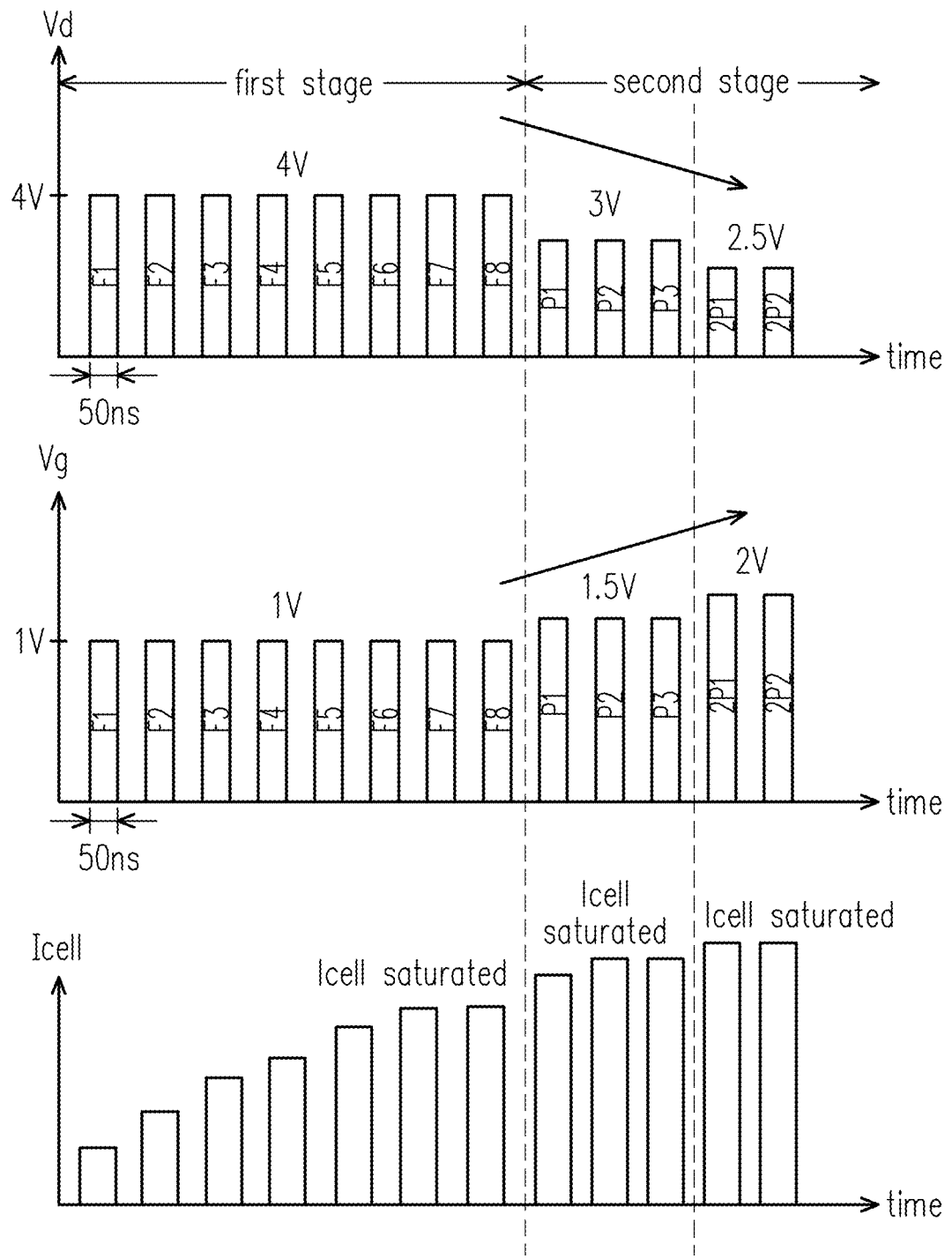
FIG. 5A shows an example of applying a bias voltage for the filament forming method of the resistive memory of the embodiment.

FIG. 4 is a schematic flowchart of the filament forming method for the resistive memory according to the embodiment of the disclosure. FIG. 5A is a waveform diagram of the applied voltage in the process of the filament forming method of the resistive memory of the embodiment.

Referring to FIG. 4 and FIG. 5, a first stage of filament forming is performed to the resistive memory in an initial high resistance state. In step S100, the gate voltage Vg and the drain voltage Vd (first bias voltage) are applied to the resistive memory unit. The gate voltage Vg and the drain voltage Vd are, for example, pulse voltages with a certain width. In the embodiment, the gate voltage Vg of the first bias voltage is, for example, 1V, and its pulse width PW is 50 ns for example; the drain voltage Vd of the first bias voltage is, for example, 4V and its pulse width PW is 50 ns for example.

Next, in step S102, a read current Icell of the resistive memory unit is sensed, and the read current Icell is latched. For example, a register (such as a shift register) or a storage unit with similar functions can be provided in the memory system to latch the latest read current Icell.

Next, in step S104, it is determined whether a rate of increase of the read current Icell is less than a second threshold value. When the rate of increase of the read current Icell is not less than the second threshold value, it means that the read current Icell has not reached a saturating state. Then, a cycle of steps S100, S102 and S104 will be repeated to continuously apply the gate voltage Vg and the drain voltage Vd (first bias voltage) to the resistive memory until the increasing rate of the read current Icell is less than the second threshold value.

In one embodiment, when a N-bit shift register is used to store the read current Icell, $\frac{1}{2}^N$ can be used as the second threshold value. For example, when a 3-bit shift register is used to store the read current Icell, $\frac{1}{2}^3 = 0.125$ can be used as the second first threshold value.

In step S104, when the rate of increase of the read current Icell is determined to be less than the second threshold value, it means that the read current Icell reaches the saturating state, and the first stage of filament forming is finished. Next, in step S106, the read current Icell is latched as a saturating read current. As shown in FIG. 5A, the read current Icell of the first stage reaches the saturating state after applying 8 times of the first bias voltage (F1~F8), and the read current corresponding to the pulse voltage F8 is latched as the saturating read current.

Next, in step S110, it is determined whether a rate of increase of the saturating read current due to the resistive memory unit being unstable is less than a first threshold value or not. When the rate of increase of the saturating read current is not less than the second threshold value, it means that the oxygen vacancy and the oxygen ions can be further generated in the dielectric layer (TMO) and the formed filament structure does not reach a stable state. At this time, a second stage of the filament forming is further performed on the resistive memory. At this time, the resistive memory is in an initial low resistance state.

In one embodiment, when a N-bit shift register is used to store the read current Icell, $\frac{1}{2}^N$ can be used as the first threshold value. For example, when a 3-bit shift register is used to store the read current Icell, $\frac{1}{2}^3 = 0.125$ can be used as the first threshold value.

In step S110, when the rate of increase of saturating read current due to the resistive memory unit being unstable is not less than the first threshold value, step S112 is performed to increase the gate voltage Vg and reduce the drain voltage Vd as a second bias voltage. After that, returning to step S100, the gate voltage Vg and the drain voltage Vd (the second bias voltage) are applied to the resistive memory unit, and the cycle of steps S100, S102 and S104 will be performed again until the read current Icell reaches the saturating state again (the increasing rate of the read current Icell is less than the second threshold value). After that, the saturating read current Icell is latched again (step S106). As shown in the second stage in FIG. 5A, when it determines that the rate of increase of the saturating read current is not less than the first threshold value, the gate voltage Vg is increased to 1.5V and the drain voltage is decreased to 3V to serve as the second bias voltage. After the second bias voltage is applied to the resistive memory unit for 3 times P1~P3, the read current Icell of the resistive memory unit reaches the saturating state again. At this time, the read current Icell corresponding to the pulse voltage P3 is latched as the saturating read current. Similarly, when it still determines that the rate of increase of the saturating read current is not less than the first threshold value, the gate voltage Vg is increased to 2V and the drain voltage is decreased to 2.5V to serve as a third bias. After the third bias is applied to the resistive memory unit for 2 times 2P1~2P2, the read current Icell of the resistive memory unit reaches the saturating state again. At this time, the read current Icell corresponding to the pulse voltage 2P2 is latched as the saturating read current.

As shown in FIG. 4 and FIG. 5A, in the embodiment, before the rate of increase of the saturating read current is determined to be less than the first threshold value, the bias voltage applied to the resistive memory unit is continuously adjusted until the rate of increase of the saturating read current is less than the first threshold value. Here, the increase amount of the gate voltage Vg and the decrease amount of the drain voltage Vd in the bias voltage are not particularly limited.

Returning to step S110, when it determines that the rate of increase of the saturating read current is less than the second threshold value, it means that the filament structure reaches a stable state, and the second stage of the filament forming is finished. Next, the final verification stage is performed to verify whether the saturating read current of the resistive memory unit reaches a target current value. Specifically, step S120 is performed to determine whether the saturating read current has reached the target current value. When it determines that the saturating read current has reached the target current value, the filament forming method is finished.

When it determines that the saturating read current does not reach the target current value, step S122 is performed to increase the gate voltage Vg and the drain voltage Vd, and then in step S124, the increased gate voltage Vg and the increased drain voltage Vd is applied to the resistive memory unit. Next, the read current Icell is re-sensed in step S126 and whether the read current Icell reaches the target current value or not is determined. If the read current Icell reaches the target current value, the filament forming method is finished. On the contrary, the cycle of steps S122, S124 and S126 are continuously performed again until the read current Icell reaches the target current value.

Figure 5B:
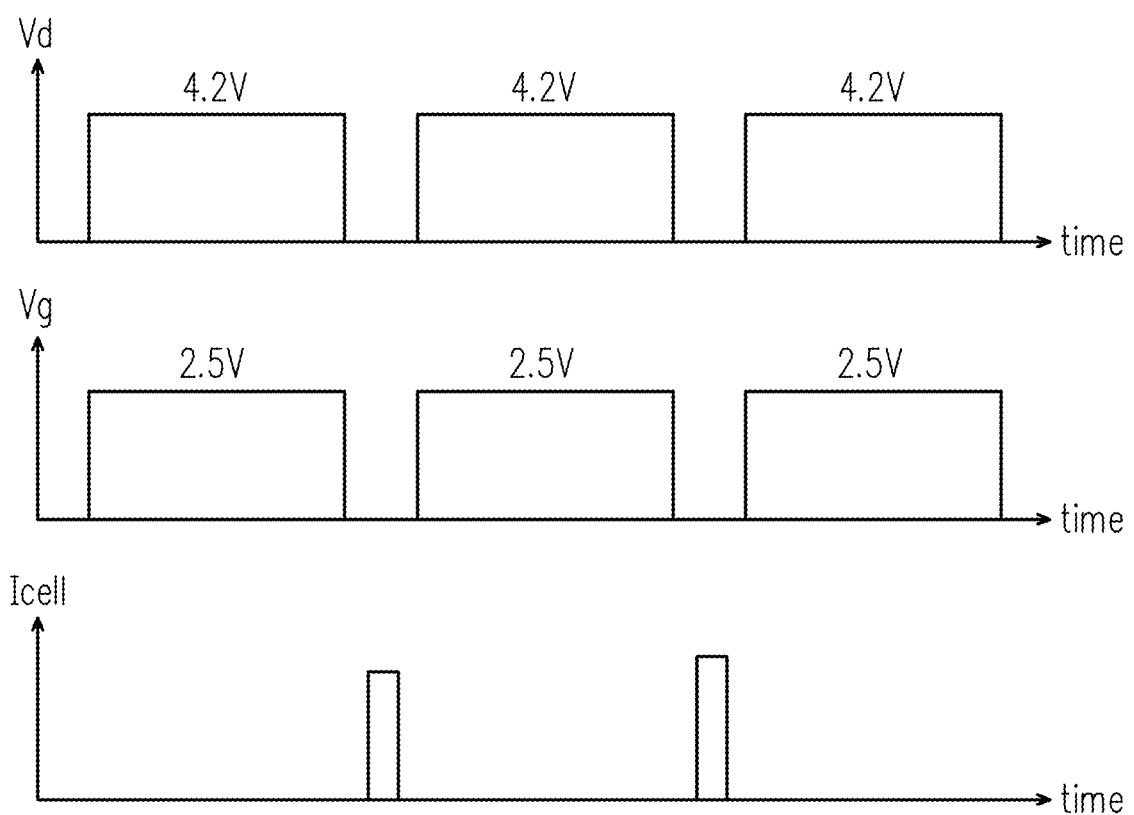
FIG. 5B shows the bias application method of the filament forming method based on a current method.
Figure 6A:
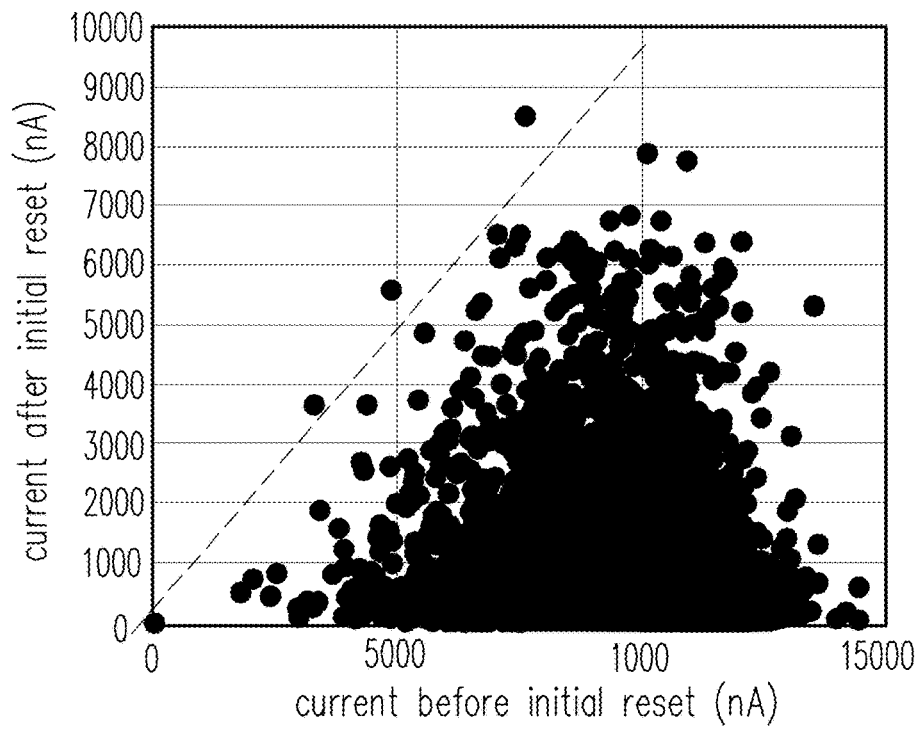
FIG. 6A shows the distribution diagram of the initial current and the current after RESET after the forming process according to the embodiment of the disclosure.
Figure 6B:
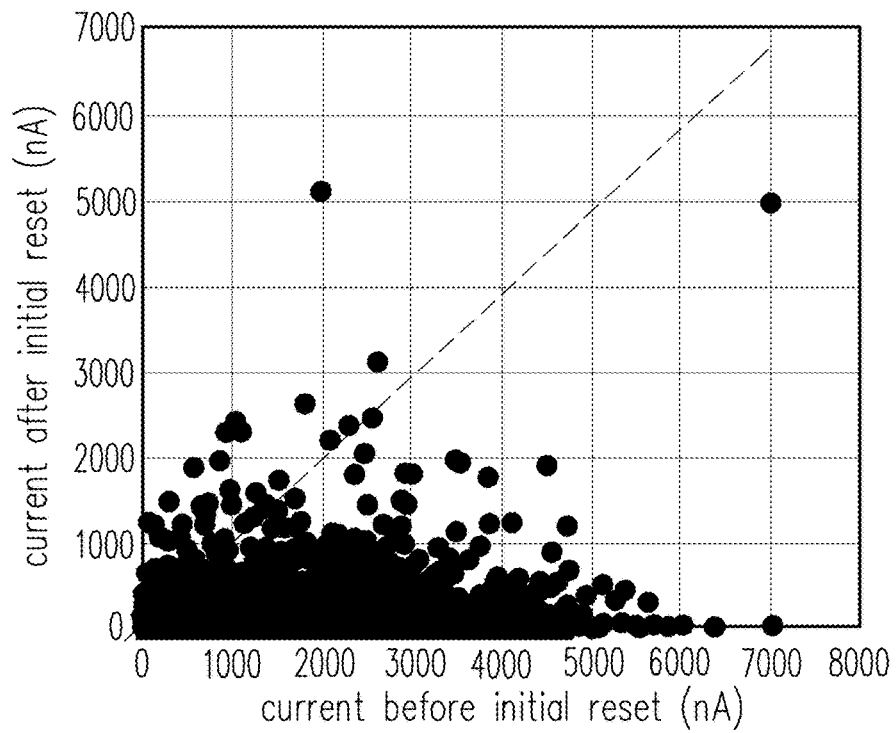
FIG. 6B shows the distribution diagram of the initial current and the current after RESET after using the conventional forming process of FIG. 5B.

FIG. 6A shows the distribution diagram of the current before initial RESET and the current after initial RESET after performing the filament forming method according to the embodiment is used. FIG. 6B shows the distribution diagram of the current before initial RESET and the current after initial RESET after performing the filament forming method according to the conventional forming process of FIG. 5B. As shown in FIG. 6A, after performing the filament forming with the process of FIG. 4 by using the embodiment, the resistive memory unit has an obvious low resistance state (the current before the initial RESET is high) and the current tail hardly appears above the dotted line in FIG. 6A after the initial RESET. Therefore, it can be seen that the filament structure formed by the invention has a stable state and avoid a large current tail.

On the contrary, for comparison, through the voltage application method of the conventional filament forming method as shown in FIG. 5B, it can be seen from FIG. 6B that an obvious low resistance state (the current before the initial RESET is low) can not be formed and there are still many current tails above the dotted line after the initial RESET.

As described above, in the embodiment, first, the filament forming method will verify repeatedly whether or not the formed filament structure reaches the stable state by two-stage filament forming. After determining that the formed filament structure is stable, it then verifies whether or not the read current of the resistive memory unit reaches the target current value. Compared with the conventional method, it directly verifies whether the read current reaches the target current value under a situation whether or not the filament structure is stable is not determined. The filament forming method of the embodiment can effectively reduce the generation of current tails and increase the reliability of the resistive memory unit.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A filament forming method for a resistive memory unit, comprising:

applying a first bias voltage to the resistive memory unit for a number of times until a read current of the resistive memory unit reaches a first saturating state, wherein the first bias for each time includes a gate voltage and a drain voltage;

latching the read current in the first saturation state as a saturating read current;

determining whether or not a rate of increase of the saturating read current is less than a first threshold value, wherein when oxygen vacancy and oxygen ions are further generated in a dielectric layer of the resistive memory unit and the resistive memory unit does not reach a stable state, the saturating read current is further increased;

when the rate of increase of the saturating read current is determined to be not less than the first threshold value, increasing the gate voltage and decreasing the drain voltage of the first bias voltage to serve as a second bias voltage;

applying the second bias to the resistive memory unit until the read current of the resistive memory unit reaches a second saturation state, latching the read current in the second saturation state as a saturating read current; and determining whether or not the rate of increase of the saturating read current is less than the first threshold value; and when determining the rate of increase of the saturating read current is less than the first threshold value, determining whether or not the saturating read current reaches a target current value, and finishing the filament forming method when the target current value is reached.

2. The filament forming method of the resistive memory unit according to claim 1, when a rate of increase of the read current is less than a second threshold value, determining that the read current reaches the first saturating state.

3. The filament forming method of the resistive memory unit according to claim 1, wherein in a case that the read current in the second saturating state is latched as the saturating read current and determines that the rate of increase of the saturating read current is not less than the first threshold value, the method further comprises:

increasing the gate voltage and decreasing the drain voltage with respect to the second bias voltage to serve as a third bias voltage;

applying the third bias voltage to the resistive memory unit until the read current of the resistive memory unit reaches a third saturating state;

latching the read current in the third saturating state as the saturating read current; and determining again whether or not the rate of increase of the saturating read current is less than the first threshold value.

4. The filament forming method of the resistive memory unit according to claim 1, further comprising:
when determining that the saturating read current does not reach the target current value, increasing the gate voltage and the drain voltage;
applying the increased gate voltage and the increased drain voltage to the resistive memory, and determining whether or not the read current of the resistive memory unit reaches the target current value.

5. The filament forming method of the resistive memory unit according to claim 2, wherein the second threshold voltage is determined by a bit number of a storage unit that latches the read current.

6. The filament forming method of the resistive memory unit according to claim 5, wherein when the bit number is N (N is a positive integer), the second threshold value is $\frac{1}{2^N}$.

7. The filament forming method of the resistive memory unit according to claim 1, wherein the drain voltage is greater than the gate voltage.

8. A filament forming method of a resistive memory unit, comprising:
performing a first stage forming process to apply a first bias voltage including a gate voltage and a drain voltage to the resistive memory unit for plural times until a read current of the resistive memory unit reaches a first saturating state, latching the read current in the first saturating state as a saturating read current, and determining whether or not a rate of increase of the saturating read current is less than a first threshold value, wherein when oxygen vacancy and oxygen ions are further generated in a dielectric layer of the resistive memory unit and the resistive memory unit does not reach a stable state, the saturating read current is further increased;
when the rate of increase of the saturating read current is determined to be not less than the first threshold value, performing a second stage forming process to apply a second bias voltage to the resistive memory unit for a number of times until the read current of the resistive memory unit reaches a second saturating state, latching the read current in the second saturating state as the saturating read current and determining whether or not the rate of increase of the saturating read current is less than the first threshold value, wherein the second bias voltage is obtained by increasing the gate voltage and decreasing the drain voltage; and
when the rate of increase of the saturating read current is less than the first threshold value and the saturating read current reaches a target current value, finishing the filament forming method.

9. The filament forming method of the resistive memory unit according to claim 8, wherein when a rate of increase of the read current is less than a second threshold value, determining that the read current reaches the first saturating state.

10. The filament forming method of the resistive memory unit according to claim 8, wherein in a case that the read current in the second saturating state is latched as the saturating read current and determines that the rate of increase of the saturating read current is not less than the first threshold value, the filament forming method further comprises:
applying a third bias voltage to the resistive memory unit for a number of times, and performing the second stage forming procedure again until the read current of the resistive memory unit reaches a third saturating state, latching the read current in the third saturating state as the saturating read current, and determining again whether or not the rate of increase of the saturating read current is less than the first threshold value, in which the third bias voltage is obtained by increasing the gate voltage and decreasing the drain voltage relative to the second bias voltage.

11. The filament forming method of the resistive memory unit according to claim 8, further comprising:
when the saturating read current does not reach target current value, increasing the gate voltage and the drain voltage;
applying the increased gate voltage and the increased drain voltage to the resistive memory unit, and determining whether or not the read current of the resistive memory unit reaches the target current value.

12. The filament forming method of the resistive memory unit according to claim 9, wherein the second threshold voltage is determined by a bit number of a storage unit that latches the read current.

13. The filament forming method of the resistive memory unit according to claim 12, wherein when the bit number is N (N is a positive integer), the second threshold voltage is $\frac{1}{2^N}$.

14. The filament forming method of the resistive memory unit according to claim 8, wherein the drain voltage is greater than the gate voltage.

* * * * *